(12) United States Patent
Polesel Maris et al.

(10) Patent No.: US 10,815,571 B2
(45) Date of Patent: *Oct. 27, 2020

(54) CULINARY ITEM COMPRISING A RARE EARTH OXIDE LAYER

(71) Applicant: SEB S.A., Ecully (FR)

(72) Inventors: Jérôme Polesel Maris, Mexy (FR); Laurent Caillier, Pringy (FR); Aurélien Dubanchet, Gresy sur Aix (FR)

(73) Assignee: SEB S.A. (FR)

( * ) Notice: Subject to any disclaimer, the term of this patent is extended or adjusted under 35 U.S.C. 154(b) by 105 days.

This patent is subject to a terminal disclaimer.

(21) Appl. No.: 15/745,783

(22) PCT Filed: Jul. 19, 2016

(86) PCT No.: PCT/FR2016/051857
§ 371 (c)(1),
(2) Date: Jan. 18, 2018

(87) PCT Pub. No.: WO2017/013351
PCT Pub. Date: Jan. 26, 2017

(65) Prior Publication Data
US 2018/0171481 A1    Jun. 21, 2018

(30) Foreign Application Priority Data

Jul. 21, 2015 (FR) ..................... 15 56895

(51) Int. Cl.
| | | |
|---|---|---|
| C23C 18/12 | (2006.01) | |
| A47J 36/02 | (2006.01) | |
| C25D 9/12 | (2006.01) | |
| C23C 4/11 | (2016.01) | |
| C23C 14/08 | (2006.01) | |
| C23C 4/134 | (2016.01) | |
| B05D 5/08 | (2006.01) | |
| C25D 15/00 | (2006.01) | |
| C23C 4/129 | (2016.01) | |
| C23C 14/34 | (2006.01) | |
| B05D 1/10 | (2006.01) | |

(52) U.S. Cl.
CPC ......... *C23C 18/1216* (2013.01); *A47J 36/025* (2013.01); *B05D 5/083* (2013.01); *C23C 4/11* (2016.01); *C23C 4/129* (2016.01); *C23C 4/134* (2016.01); *C23C 14/083* (2013.01); *C23C 14/34* (2013.01); *C23C 18/127* (2013.01); *C23C 18/1254* (2013.01); *C23C 18/1258* (2013.01); *C23C 18/1291* (2013.01); *C25D 9/12* (2013.01); *C25D 15/00* (2013.01); *B05D 1/10* (2013.01); *B05D 2202/25* (2013.01)

(58) Field of Classification Search
None
See application file for complete search history.

(56) References Cited

U.S. PATENT DOCUMENTS

| | | |
|---|---|---|
| 7,887,934 B2 | 2/2011 | Gentleman et al. |
| 8,057,922 B2 | 11/2011 | Gentleman et al. |
| 8,745,904 B2 | 6/2014 | Paccaud |
| 2014/0034651 A1* | 2/2014 | Durand ............... A47J 36/025 220/573.2 |
| 2014/0178641 A1 | 6/2014 | Leblanc et al. |

FOREIGN PATENT DOCUMENTS

| | | |
|---|---|---|
| FR | 2925063 A1 | 6/2009 |
| FR | 2968016 A1 | 6/2012 |
| JP | H0343476 A | 2/1991 |

\* cited by examiner

*Primary Examiner* — Ana L. Woodward
(74) *Attorney, Agent, or Firm* — Lerner, David, Littenberg, Krumholz & Mentlik, LLP

(57) ABSTRACT

Provided is a culinary item, one surface of which is provided with a coating including at least one rare-earth oxide layer. Such a coating has the specific feature of not only having mechanical hardness and abrasion resistance comparable to those of enamels and ceramics, but also excellent intrinsic hydrophobic properties that enable the coating obtained to have a non-stick property that is comparable to that of fluorocarbon coatings and suitable for culinary applications.

15 Claims, No Drawings

CULINARY ITEM COMPRISING A RARE EARTH OXIDE LAYER

CROSS-REFERENCE TO RELATED APPLICATIONS

This application is the United States national phase of International Application No. PCT/FR2016/051857 filed Jul. 19, 2016, and claims priority to French Patent Application No. 1556895 filed Jul. 21, 2015, the disclosures of which are hereby incorporated in their entirety by reference.

Field of the Invention

The present invention generally pertains to a culinary item, at least one of the surfaces of which is equipped with a coating comprising at least one rare earth oxide layer.

Background Art

Currently, the various coatings used in culinary cooking items each present, according to their nature, essential performance properties, each differing with respect to the nature of the coating.

Thus, fluorocarbon resin-based coatings (for example polytetrafluoroethylene (PTFE) resin-based coatings) present excellent non-stick properties, while coatings based on enamel or sol-gel (more commonly known as ceramic) coatings present excellent material hardness and resistance to high temperatures (particularly in excess of 400° C.).

However, no coating currently exists with both of these properties, or at least not in an optimized manner.

Fluorocarbon resin-based non-stick coatings can, to some extent, be improved with respect to their resistance against abrasion, scratching and flaking (interlayer delamination), for example through the addition of fillers in the formulations (e.g. $SiO_2$, $TiO_2$, $Al_2O_3$, SiC, BN, diamond, etc.) while still falling short of the mechanical performance of enamel or sol-gel coatings.

The non-stick properties of sol-gel coatings may, to a certain extent, be improved, for example by introducing polydimethylsiloxane-type lubricant additives, while still falling short of the non-stick performance of fluorocarbon resin-based coatings. With respect to enamel-based coatings, their non-stick properties remain low, regardless of which known technical solution is used. To resolve this problem, the applicant has developed a coating comprising at least one rare earth oxide layer, rare earth oxides having the particularity of having not only mechanical hardness and resistance to abrasion similar to enamels and ceramics, but also excellent intrinsic hydrophobicity, giving the obtained coating non-stick attributes that are comparable to fluorocarbon resin-based coatings adapted for culinary applications.

The use of rare earth oxides in ceramic coatings is known to persons of ordinary skill in the art. Thus, patent document FR2925063 describes a ceramic layer rich in rare earth oxides used in the domain of capacitors or steam turbines. This document describes a metal substrate covered in a manner comprising a primary oxide and a secondary oxide. The primary oxide is cerium and hafnium oxide and the secondary oxide is a secondary oxide cation selected from the group comprising rare earth cations, yttrium and scandium.

The coating described in document FR2925063 results in ceramic materials with relatively high repellency to liquids, such as water.

SUMMARY OF THE INVENTION

The present invention thus relates to a culinary item comprising a support having an inner surface capable of receiving foods and an outer surface intended to interface with a heat source, and a coating applied to at least one of the two surfaces, characterized in that the coating comprises at least one rare earth oxide layer, whether continuous or discontinuous, comprising a matrix of at least one rare earth oxide.

According to one advantageous alternative to the invention, the rare earth oxide matrix may comprise at least one lanthanide oxide.

According to another advantageous alternative, the rare earth oxide matrix may comprise cerium oxide, alone or mixed with at least one other lanthanide oxide.

The incorporation of cerium oxide in the rare earth oxide matrix provides a barrier effect (anti-corrosion, anti-oxidation, impermeability to liquids and gas).

This barrier effect is due to the hydrophobic properties of cerium oxide (commonly known as ceria) which, among other things, makes it insoluble in water.

Advantageously, this rare earth oxide layer may also comprise fillers dispersed in said matrix, said fillers being selected from the group comprising fluorocarbon resins, polyetheretherketones (PEEK), polyetherketones (PEK), polyimides (PI), polyamide-imides (PAI), polyethersulfones (PES), polyphenylene sulfides (PPS), silicone beads and mixtures thereof.

This type of addition improves, or even eliminates, problems related to the fracturing of the lanthanide oxide layer resulting from the dissipation of mechanical energy. This type of addition does not alter the hydrophobicity of the rare earth oxide layer.

Preferably, the fillers may include a fluorocarbon resin selected from the group comprising PTFE, modified PTFE, tetrafluoroethylene and perfluoropropyl vinyl ether (PFA) copolymers, tetrafluoroethylene and hexafluoropropylene (FEP) copolymers and mixtures thereof.

In the context of the present invention, the fillers may preferably be present to an extent ranging between 0.1 and 50% by weight relative to the total dry weight of the rare earth oxide layer. The filler content must not exceed 50% by weight to preserve the physicochemical properties of cerium oxide.

Advantageously, the thickness of the rare earth oxide layer may be between 0.1 and 50 µm. It should be noted that the thickness of the rare earth oxide layers will vary with respect to the application method used.

Furthermore, it is preferable that the fillers do not protrude. In fact, if the fillers do protrude, particularly in the case of non-fluorinated fillers, the non-stick properties of the coating may be diminished.

Preferably, the surface of the rare earth oxide layer may be structured or textured.

Structuring of the surface of the rare earth oxide layer advantageously makes it possible to reduce the wettability of the rare earth oxide surface and thus to obtain a superhydrophobic rare earth oxide layer.

The term superhydrophobic layer, in the context of the present invention, means a surface with a water droplet contact angle greater than 150°.

In the context of the present invention, the terms structured or textured surface mean surfaces characterized by a relief or a controlled roughness.

Advantageously, the support may be made of a metal, glass, ceramic, terracotta or plastic material.

Preferably, the support may be metal and may be made of aluminum or an aluminum alloy, anodized or not, and may be polished, brushed, sanded, or bead-blasted, or of steel that may be polished, brushed, sanded or bead-blasted, or of stainless steel that may be polished, brushed, sanded or bead-blasted, or of cast steel, cast aluminum, or cast iron, or of copper, that may be hammered or polished.

Preferably, the support may be metal and may comprise alternate layers of metal and/or metal alloy, or a cap of cast aluminum, aluminum or aluminum alloy reinforced with a stainless steel exterior base.

DETAILED DESCRIPTION OF THE INVENTION

According to one embodiment of the present invention, the coating may also comprise, on the rare earth oxide layer, at least one layer comprising at least one fluorocarbon resin, alone or in a mixture with a thermostable binding resin resistant to temperatures greater than 200° C., said resin or resins forming a continuous sintered network.

Advantageously, in this embodiment, the fluorocarbon resin may be selected from the group comprising PTFE, modified PTFE, tetrafluoroethylene and perfluoropropyl vinyl ether (PFA) copolymers, tetrafluoroethylene and hexafluoropropylene (FEP) copolymers and mixtures thereof.

Preferably, in this embodiment, the binding resin may be selected from the polyamide-imides (PAI), polyetherimides (PEI), polyamides (PI), polyetherketones (PEK), polyetheretherketones (PEEK), polyethersulfones (PES), polyphenylene sulfides (PPS) and mixtures thereof.

These binding resins have the advantage of being thermostable and resistant to temperatures greater than 200° C.

As non-limiting examples of culinary items according to the present invention, special note is made of culinary items such as pots and pans, woks and frying pans, crepe pans, grills, baking forms and sheets, and barbecue grates and grills.

The culinary item according to the present invention may be prepared by any known suitable method known to persons of ordinary skill in the art. The rare earth oxide layer may, in particular, be applied by spray pyrolysis, thermal spraying, PVD (physical vapor deposition) process, sol-gel process, or by electrochemical processes or sintering.

It should be noted that the starting material for the application of the rare earth oxide layer may have one of two forms:
  either a rare earth oxide powder, pure or mixed with other materials in powder form;
  or a stabilized colloidal rare earth oxide dispersion in an aqueous or solvent medium;
  or a precursor solution of rare earth salts such as nitrate, acetate, acetylacetonate, chloride or ammonium in water, an alcohol or an ester.

Such a precursor solution may also comprise one or more additives. The additive or additives may, in particular, be an acid such as acetic acid, citric acid or tartaric acid. These acids are used as precursor salt complexing agents, particularly for rare earth salt precursors. The introduction of such additives in the precursor solution may thus make it possible to obtain a uniform and dense rare earth oxide network, thus limiting the formation of pores in the matrix of a layer.

Application by spray pyrolysis involves the spraying or nebulizing of droplets of a rare earth salt precursor solution onto at least one of the surfaces of a culinary item maintained at a high temperature, preferably greater than 350° C. The temperature of the surface of the item is maintained at a threshold to allow the pyrolysis of the rare earth salt to occur prior to coming into contact with the surface so as to generate a rare earth oxide that adheres to the surface in the form of nanoparticles. Spray pyrolysis deposition makes it possible to obtain a rare earth oxide layer by additive effect.

Post-curing of the item at a higher temperature than that used when the layer is deposited may improve the crystallinity and density of the rare earth oxide layer (for example, post-curing may be carried out at a temperature above 400° C.).

A thermal spray application (or thermal spraying) is performed at a temperature that enables the fusion of the rare earth oxide, which is present in the form of a rare earth oxide powder alone or in a mixture with other powdered materials, or in the form of a solution of precursors of rare earth salts.

In the event that the starting compound has the form of a fine powder of rare earth oxide, it would be injected as close to the flame or torch as possible. The inner core temperature (ideally>2500° C.) allows for the fusion of the oxide powder grains, the continual flow of combustible or ionized gas fueling the torch simultaneously inducing a projection with sufficient kinetic energy to project the molten grains onto the surface of a culinary item, bind them to said item and thus gradually develop a dense layer.

Instead of the powder, a starting compound of precursors of rare earth salts in solution could also be injected into the plasma torch or flame spray, but in an area with a lower temperature to initiate the pyrolysis of the rare earth salts and project them onto the surface of the culinary item to produce a rare earth oxide layer. With an atmospheric plasma torch, ambient oxygen induces oxidation.

The means of thermal spray applications (or thermal spraying), in the context of the present invention, may consist of a plasma torch using an ionized gas composition such as argon/hydrogen Ar—$H_2$, or a HVOF thermal spray or flame spray using an air/fuel gas composition such as oxygen and acetylene.

For example, the thermal spray plasma torch generates a core flame temperature of approximately 15,000° C. During thermal spray projection, the surface of the culinary item is maintained at a temperature of 200° C. to 350° C. to improve the kinetic spreading and bonding of the molten oxide particles at their point of impact on the surface. Cumulatively, layers of several microns, or tens of microns, can thus be developed.

Advantageously, as mentioned above, fillers may be dispersed in the rare earth oxide layer.

These fillers may notably be introduced in the form of a dispersion of polymeric particles (in a solution of precursors of rare earth salts) or in the form of a dry powder (in a solution of precursors of rare earth salts or in a powder comprising rare earth oxide).

In the event that the starting compound comprises fillers, the procedure to apply the rare earth oxide layer must be optimized so as not to provoke the total thermal degradation of the fillers during application.

Advantageously, as mentioned above, the rare earth oxide layer may be structured, or textured.

This structuring may be obtained, for example, by stamping the surface of the support of a culinary item, by chemical or physical etching of the surface of the support of a culinary item that was previously covered with a resin carrying the pattern to be reproduced, said resin being, preferably, photocurable.

EXAMPLES

Example 1

Preparation and Application by Spray Pyrolysis of a Cerium Oxide Layer

The precursor composition is prepared as follows:
cerium acetate ($Ce(OOCCH_3)_3$—$H_2O$) is diluted in a mixture of water:ethanol with a volumetric concentration of 70:30.

then, the solution is agitated for 36 hours at ambient temperature to obtain a clear solution with no precipitates, having a cerium concentration of 0.02 mol/L.

This composition is applied multiple times using spray pyrolysis onto the surface of a stainless steel sample. These applications are implemented by means of a spray gun or nebulizer with the sample approximately 20 cm from the spray gun or nebulizer, the surface of the sample being maintained at a temperature above 350° C. to crystallize the cerium oxide as a solid on the sample's surface.

The application of 10 to 20 spray cycles results in a solid rare earth oxide layer with submicron thickness between 100 and 400 nm.

Example 2

Preparation and Application by Spray Pyrolysis of a Cerium Oxide Layer

Following the same procedure described in Example 1, a rare earth oxide layer is applied from a precursor composition prepared by adding L-proline as a chelating agent to cerium (III) nitrate hexahydrate ($Ce(NO_3)_3$-$6H_2O$) in a 1:1 molar ratio.

Example 3

Preparation and Application by Spray Pyrolysis of a Cerium Oxide Layer

A precursor composition is prepared by diluting cerium (III) chloride heptahydrate ($CeCl_3$-$7H_2O$) in a water:ethanol mixture with a 3:1 molar ratio to obtain a cerium concentration ranging between 0.05 and 0.025 mol/L.

In this embodiment, the spray deposition is achieved according to the same process described in Example 1 on the surface of a glass sample maintained at 400° C. to obtain a continuous and homogenous rare earth oxide layer.

Example 4

Preparation and Application by Thermal Spray (or Thermal Projection) of a Cerium Oxide Layer The precursor composition is prepared as follows:
75 g of cerium (III) nitrate hexahydrate ($Ce(NO_3)_3$-$6H_2O$) are dissolved in 1.5 liters of pure water;
then the solution is agitated for 20 minutes.

The precursor composition is then injected into a plasma torch configured with a stream of a carrier gas (such as an Ar-$H_2$ mixture) capable of causing the pyrolysis of the cerium salts prior to their contacting the surface of the aluminum sample.

The cerium, thus atomized, is found oxidized in the form of cerium oxide on the surface. Gradually, a cerium oxide layer is thus achieved on the sample surface.

Example 5

Preparation and Application by Thermal Spray Application (or Thermal Spraying) of a Cerium Oxide Later Comprising Fluoroploymer Fillers A powder is prepared by mixing cerium oxide powder with a grain size ranging from 30 to 70 microns, and PTFE powder (or PFA) with a grain size ranging from 10 to 50 microns.

The powder is then injected into a plasma torch configured with a stream of a carrier gas (such as an Ar—$H_2$ mixture) capable of causing the pyrolysis of the cerium oxide prior to contacting the surface of the aluminum sample. The projection distance between the torch and the surface of the sample is approximately 125 mm, and the powder is sprayed out of the plasma torch at a linear displacement speed of approximately 75 m/min.

The surface of the sample onto which the powder is applied is maintained at a temperature of 300° C. to improve the kinetic spreading of the molten oxide grains and the homogeneity of the rare earth oxide layer comprising PTFE (or PFA) particles.

The resulting rare earth oxide layer reaches a thickness of a few dozen microns.

Example 6

Preparation and Application via PVD of a Layer of Cerium Oxide, onto a Structured Sample The superhydrophobic rare earth oxide layer is generated in two successive steps:

1) texturing the surface of an aluminum-type metal sample; followed by

2) PVD deposition of the hydrophobic cerium oxide layer on the textured surface of the sample.

There are many possible variations of Step 1), the texturizing step.

For example, the first variant consists of texturizing the sample surface by means of chemically etching the surface (deposition of photocurable resin/exposure via a suitably adapted mask/treatment of unexposed areas with solvent to create the design element to be reproduced), leading to the formation of texturized areas on the sample surface.

Pattern depth can be controlled by the time allotted for etching. The textured areas are 9 μm wide, separated from each other by a distance of 11 μm and have a depth of 15 μm.

The second variation consists of randomly texturizing the surface of the sample with chemical etching.

In this embodiment, the aluminum sample surface is randomly exposed to acid to obtain the following roughness characteristics:

Ra of 5 microns,

Rq of 5 microns, and

Rz of 25 microns.

The third embodiment consists of using a texturized matrix to stamp the surface of the sample.

In this embodiment, the surface of the sample is texturized under pressure using a hard textured matrix made of titanium nitride. The reproduced textured areas are 9 μm wide, separated from each other by a distance of 11 μpm and have a depth of 15 μm.

Step 2 consists of depositing a continuous layer of cerium oxide on the texturized surface using PVD technology. The deposition is performed under vacuum, using a sintered cerium oxide target.

The resulting layer has a thickness of between 50 nm (on the randomly texturized surface of the second variant) and 500 nm (on the surface comprising the areas of the first and third variants) and accurately replicates the texturing contours.

Example 7

Preparation and Application by Sol-Gel Process (Alkoxides) of a Cerium Oxide Layer

Cerium butoxide is mixed with 2-butanol in a molar ratio of 0.1; acetylacetonate, used as a chelating agent, is then added to the mixture.

Then, an aqueous solution of hydrochloric acid concentrated to 1 mol/L is introduced, while stirring, drop by drop (note that the molar ratio of cerium butoxide/acetyl acetonate is 2, and that of cerium butoxide/water is 0.5), and the resulting sol is agitated for 48 hours to reach the appropriate balance of hydrolysis and condensation reactions.

An inorganic black pigment, composed of a copper-chrome oxide and iron, is then added at 5% by weight relative to the total weight of the solution, and finally, an alpha alumina filler is introduced, while stirring, at up to 4% by weight relative to the total weight of the solution.

In this embodiment, a layer of cerium oxide is formed by sol-gel process, making use of the hydrolysis/condensation of the cerium butoxide.

To do this, the obtained solution, as previously described, is sprayed onto the surface of an aluminum sample, which has been previously sanded and degreased, the surface of the sample having been heated to a temperature of 60 to 80° C. to prevent dripping and to vent a portion of the solvents during the coating process.

To achieve adequate layer thickness while minimizing the risk of cracking, the initial layer undergoes a drying process at 80° C. for 5 minutes, prior to spraying a second layer of the same sol-gel solution onto the sample.

The rare-earth oxide layer undergoes a prebaking step at 120° C. for 10 minutes to evaporate the majority of solvents.

Finally, the entire sample and rare earth oxide layer is subject to thermal treatment at 350° C. to densify the cerium oxide network.

The obtained rare earth oxide layer has a thickness of 15 μm, with no visible cracking observed using a binocular microscope.

Example 8

Preparation and Application, using a Sol-Gel (Alkoxides) Pprocess, of a Rare Earth Oxide Layer Comprising Fluoropolymer Fillers

A PTFE powder is added to the sol-gel solution from Example 7, constituting up to 2% by weight of the total weight of the solution. Then a cerium layer is applied using a sol-gel process, making use of the hydrolysis/condensation reaction of the cerium butoxide as described in Example 7.

It should be noted that these PTFE particles are used to improve the hydrophobicity and non-stick properties of the rare earth oxide layer.

Example 9

Preparation and Application, using a Sol-Gel (Salts) Process, of a Cerium Oxide Layer Comprising Fluoropolymer Fillers

Cerium nitrate is dissolved in deionized water to obtain a concentration of 1 mol/L, then 99.5% purity grade citric acid is added, while stirring, with a cerium nitrate/citric acid molar ratio of 0.5

The solution is agitated for 1 hour at ambient temperature, and a mixture of isopropanol and PTFE powder (mass ratio of 48/2) is then added to the solution in a volumetric ratio of 1:1, to improve the service life of the sol and to introduce fluorinated fillers to improve the hydrophobic properties of the coating.

Finally, the solution is agitated for 24 hours to obtain a stable and translucent sol.

The obtained solution is then sprayed to obtain a layer of rare earth oxide on the surface of a smooth and previously degreased aluminum sample, the surface of the which has been heated to a temperature of 40 to 60° C. to prevent dripping and to vent a portion of the solvents during the coating process.

After an initial drying at 100° C. for 10 minutes, the aluminum sample undergoes a thermal treatment at 380° C. for 30 minutes to condense the cerium oxide network.

A 500 nm thick cerium oxide layer is obtained.

Example 10

Preparation and Application, by an Electrochemical Sintering Process of a Layer of Cerium Oxide

A smooth and previously degreased aluminum sample is positioned on the negative electrode of an electroplating system.

The precursors $Ce(NO_3)_3 \cdot 6H_2O$ are in an aqueous solution (0.1 mol/L) in the presence of ammonia $NH_3$ at a 5% volumetric concentration.

The cerium hydroxide-based rare earth oxide layer is formed in 1 hour by applying a 3V deposition potential to the electroplating system.

The amorphous cerium hydroxide-based rare earth oxide layer is finally oxidized by air at 550° C. for 5 hours to produce a film of cerium oxide 0.5 microns in thickness.

RESULTS OF TESTS CONDUCTED

Hydrophobicity testing of the obtained coatings

The hydrophobic nature of the coatings obtained according to the preceding examples were tested by measuring the contact angle of a drop of water on the coating using a GBX Digidrop goniometer. The results of these measurements are shown in the table below.

| Examples | Contact angle (in °) |
| --- | --- |
| 1 | 105 |
| 2 | 105 |
| 3 | 105 |
| 4 | 110 |
| 5 | 115 |
| 6 | 170 |
| 7 | 105 |
| 8 | 115 |
| 9 | 115 |
| 10 | 115 |

The invention claimed is:
1. A culinary item comprising a support having an inner surface capable of receiving foods and an outer surface intended to face a heat source, and a coating applied to at least one of the two surfaces, wherein the coating comprises at least one rare earth oxide layer comprising a matrix of at least one rare earth oxide, and wherein the rare earth oxide layer further comprises fillers that comprise particles dispersed in said matrix, said fillers being selected from the group consisting of fluorocarbon resins, polyetheretherketonces (PEEK), polyetherketones (PEK), polyimides (PI), polyamide-imides (PAI), polyethersulfones (PES), polyhenylene sulfides (PPS), silicone beads and mixtures thereof.

2. The culinary item according to claim 1, wherein said matrix comprises at least one lanthanide oxide.

3. The culinary item according to claim 1, wherein said matrix comprises cerium oxide, alone or in a mixture with at least one other lanthanide oxide.

4. The culinary item according to claim 1, wherein the fillers include a fluorocarbon resin selected from the group comprising polytetrafluoroethylene (PTFE), tetrafluoroethylene and perfluoropropyl vinyl ether (PFA) copolymers, tetrafluoroethylene and hexafluoropropylene (FEP) copolymers and mixtures thereof.

5. The culinary item according to claim 1, wherein the fillers are present at a concentration of 0.1 to 50% by weight relative to the total dry weight of the rare earth oxide layer.

6. The culinary item according to claim 1, wherein the thickness of the rare earth oxide layer is between 0.1 and 50 µm.

7. The culinary item according to claim 1, wherein the rare earth oxide layer is structured such that a surface of the rare earth oxide layer comprises a relief or controlled roughness.

8. The culinary item according to claim 1, wherein the support is made of a metal, glass, ceramic, terracotta or plastic material.

9. The culinary item according to claim 8, wherein the support is metal and is made of aluminum or an aluminum alloy, anodized or not, and or of steel, or of stainless steel, or of cast aluminum, or cast iron, or of copper.

10. The culinary item according to claim 9, wherein the aluminum, aluminum alloy steel, or stainless steel support is polished brushed, sanded, or bead-blasted.

11. The culinary item according to claim 9, wherein the cast steel, cast aluminum, cast iron, or copper support is hammered or polished.

12. The culinary item according to claim 8, wherein the support is made of metal and comprises alternate layers of metal and/or metal alloy, or a cap of cast aluminum, aluminum or aluminum alloy reinforced with a stainless steel exterior base.

13. The culinary item according to claim 1, wherein the coating further comprises, on the rare earth oxide layer, at least one layer comprising at least one fluorocarbon resin, alone or in a mixture with a thermostable binding resin resistant to temperatures greater than 200° C., said resin or resins forming a continuous sintered network.

14. The culinary item according to claim 13, wherein the fluorocarbon resin is selected from the group comprising polytetrafluoroethylene (PTFE), tetrafluoroethylene and perfluoropropyl vinyl ether (PFA) copolymers, tetrafluoroethylene and hexafluoropropylene (FEP) copolymers and mixtures thereof.

15. The culinary item according to claim 13, wherein the binding resin is selected from the polyamide-imides (PAI), polyetherimides (PEI), polyamides (PI), polyetherketones (PEK), polyetheretherketones (PEEK), polyethersulfones (PES), polyphenylene sulfides (PPS) and mixtures thereof.

* * * * *